United States Patent
Lin et al.

(10) Patent No.: US 10,230,371 B2
(45) Date of Patent: Mar. 12, 2019

(54) SWITCH CONTROL DEVICE AND METHOD FOR ELECTRONIC DEVICE, AND ELECTRONIC DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lin Lin, Beijing (CN); Wei Sun, Beijing (CN); Lili Chen, Beijing (CN); Chungchun Chen, Beijing (CN); Mubing Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/525,925

(22) PCT Filed: Sep. 9, 2016

(86) PCT No.: PCT/CN2016/098545
§ 371 (c)(1),
(2) Date: May 10, 2017

(87) PCT Pub. No.: WO2017/124762
PCT Pub. Date: Jul. 27, 2017

(65) Prior Publication Data
US 2018/0083627 A1 Mar. 22, 2018

(30) Foreign Application Priority Data
Jan. 18, 2016 (CN) .......................... 2016 1 0032300

(51) Int. Cl.
*H03K 19/0175* (2006.01)
*H03K 17/687* (2006.01)

(52) U.S. Cl.
CPC ... *H03K 19/017509* (2013.01); *H03K 17/687* (2013.01); *H03K 2217/0072* (2013.01)

(58) Field of Classification Search
CPC ..................... H03K 19/017509; H03K 17/687
(Continued)

(56) References Cited

U.S. PATENT DOCUMENTS

2008/0116963 A1 5/2008 Jung
2013/0175869 A1 7/2013 Lee et al.
(Continued)

FOREIGN PATENT DOCUMENTS

CN 1658483 8/2005
CN 201004612 1/2008
(Continued)

OTHER PUBLICATIONS

International Search Report and Written Opinion in PCT/CN2016/098545 dated Dec. 15, 2016, with English translation.
(Continued)

*Primary Examiner* — Daniel D Chang
(74) *Attorney, Agent, or Firm* — Womble Bond Dickinson (US) LLP (57) ABSTRACT

The present disclosure provides a switch control device and method for electronic device, and an electronic device. The switch control device of the electronic device comprises: a high level output unit, connected with the high level input terminal and configured to output a high level with a predetermined amplitude to the high level input terminal, the predetermined amplitude higher than a predetermined voltage; a logic level output unit configured to output a logic level; and a switch unit, with a control terminal inputted with
(Continued)

the logic level, a first terminal inputted with the ground terminal, and a second terminal inputted with a low level, and configured to connect the first terminal and the second terminal when the logic level is in a first state, in order to turn on the electronic device, and disconnect the first terminal from the second terminal when the logic level is in a second state, in order to turn off the electronic is device.

17 Claims, 5 Drawing Sheets

(58) Field of Classification Search
USPC .......................................................... 326/80
See application file for complete search history.

(56) References Cited

U.S. PATENT DOCUMENTS

| | | | | |
|---|---|---|---|---|
| 2013/0264961 | A1* | 10/2013 | Chang | ............ H04B 1/48 315/201 |
| 2014/0097755 | A1* | 4/2014 | Lee | ............ H05B 33/0887 315/122 |
| 2015/0312982 | A1* | 10/2015 | Melanson | .......... H05B 33/0815 315/287 |

FOREIGN PATENT DOCUMENTS

| | | |
|---|---|---|
| CN | 202309677 | 7/2012 |
| CN | 202309677 U | 7/2012 |
| CN | 203608177 | 5/2014 |
| CN | 204145454 U | 2/2015 |
| CN | 204669334 U | 9/2015 |
| CN | 105656468 A | 6/2016 |

OTHER PUBLICATIONS

"First office action," CN Application No. 201610032300.7 (dated Feb. 12, 2018).

* cited by examiner

SWITCH CONTROL DEVICE AND METHOD FOR ELECTRONIC DEVICE, AND ELECTRONIC DEVICE

RELATED APPLICATIONS

The present application is the U.S. national phase entry of PCT/CN2016/098545, with an international filing date of Sep. 9, 2016, which claims the benefit of Chinese Patent Application No. 201610032300.7, filed on Jan. 18, 2016, the entire disclosures of which are incorporated herein by reference.

TECHNICAL FIELD

The present disclosure relates to the technical field of switch controlling of an electronic device and, in particular, to a switch control device and method for electronic device, and an electronic device.

BACKGROUND

Figure 1:
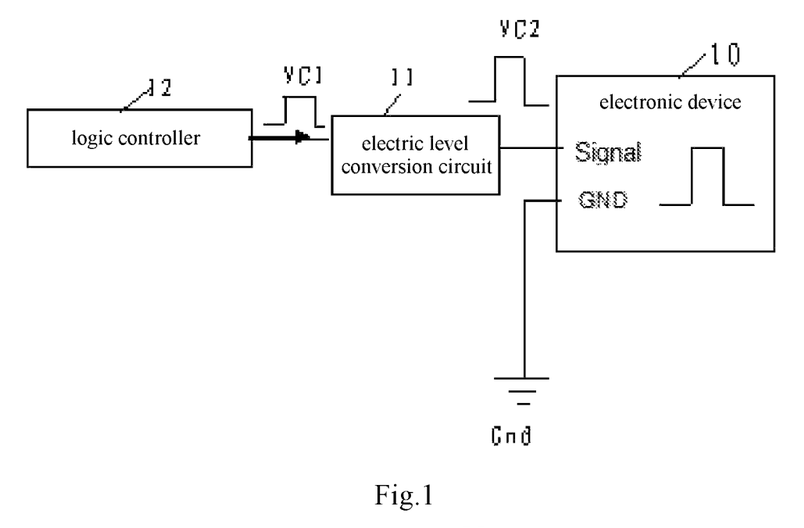
FIG. 1 is a structure diagram of a traditional switch control device for electronic device.

Traditionally, as shown in FIG. 1, an electric level conversion circuit 11 converts a high level VC1 with a maximum amplitude 3.3V, which is outputted from a logic controller 12, to a high level VC2 with a maximum amplitude 5.5V, and then outputs VC2 to a high level input terminal Signal of an electronic device 10, in order to turn on the electronic device 10. When the logic controller 12 outputs a low level, the electronic device 10 is turned off. In FIG. 1, a ground terminal GND of the electronic device 10 is grounded, the ground denoted as Gnd. However, the electric level conversion circuit only generates, at maximum, a high level with an amplitude 5.5V, whereas a high level used for turning on some electronic devices is higher than 5.5V, so the electric level conversion circuit may not successfully turn on these electronic devices.

SUMMARY

It is a main object of the present disclosure to provide a switch control device and method for electronic device, and an electronic device, to solve a part or all of the problems described above.

According to a first aspect of the present disclosure, a switch control device for electronic device is provided, which electronic device comprises a ground terminal and a high level input terminal, the switch control device comprising:

a high level output unit connected with the high level input terminal and configured to output a high level with a predetermined amplitude to the high level input terminal, the predetermined amplitude higher than a predetermined voltage;

a logic level output unit configured to output a logic level; and, a switch unit, with a control terminal inputted with the logic level, a first terminal connected with the ground terminal, and a second terminal inputted with a low level, and configured to connect the first terminal and the second terminal when the logic level is in a first state, in order to turn on the electronic device, and to disconnect the first terminal from the second terminal when the logic level is in a second state, in order to turn off the electronic device.

Optionally, the high level output unit is configured to output high levels with different predetermined amplitudes to the high level input terminal in different time intervals.

Optionally, the switch unit comprises: a switch transistor, with a control terminal inputted with the logic level, a first terminal connected with the ground terminal, and a second terminal inputted with a low level.

Optionally, the switch transistor comprises a switch triode, with a base inputted with the logic level, a first terminal connected with the ground terminal, and the second terminal inputted with a low level.

Optionally, the switch transistor comprises a switch MOS transistor, with a gate inputted with the logic level, a first terminal connected with the ground terminal, and a second terminal inputted with a low level.

Optionally, the switch transistor comprises a switch TFT, with a gate inputted with the logic level, a first terminal connected with the ground terminal, and a second terminal inputted with a low level.

Optionally, if the switch MOS transistor is an N-channel enhancement mode MOS transistor or a P-channel depletion mode MOS transistor, the logic level is a high level when the logic level is in a first state, and the logic level is a low level when the logic level is in a second state.

Optionally, if the switch transistor is a P-channel enhancement mode transistor or an N-channel depletion mode transistor, the logic level is a low level when the logic level is in a first state, and the logic level is a high level when the logic level is in a second state.

According to a second aspect of the present disclosure, a switch control method for electronic device is provided, which electronic device comprises a ground terminal and a high level input terminal, the switch control method comprising:

outputting, by a high level output unit, a high level with a predetermined amplitude to the high level input terminal of the electronic device, the predetermined amplitude higher than a predetermined voltage;

outputting, by a logic level output unit, a logic level;

causing, by a switch unit, a low level to be inputted to the ground terminal of the electronic device when the logic level is in a first state, in order to turn on the electronic device; and causing, by a switch unit, the ground terminal of the electronic device to be suspended when the logic level is in a second state, in order to turn off the electronic device.

Optionally, said outputting, by a high level output unit, a high level with a predetermined amplitude to the high level input terminal of the electronic device comprises:

outputting, by the high level output unit, high levels with different predetermined amplitudes to the high level input terminal in different time intervals.

Optionally, the switch unit comprises a switch transistor, and wherein causing, by a switch unit, a low level to be inputted to the ground terminal of the electronic device when the logic level is in a first state and causing, by a switch unit, the ground terminal of the electronic device to be suspended when the logic level is in a second stat comprises:

switching on, by the switch transistor, the connection between the ground terminal and a low level input terminal of the electronic device when the logic level is a first level; and switching off, by the switch transistor, the connection between the ground terminal and the low level input terminal of the electronic device when the logic level is a second level, in order to make the ground terminal of the electronic device to be suspended.

According to a third aspect of the present disclosure, an electronic device is provided, comprising a ground terminal and a high level input terminal, wherein the electronic device is configured to be controlled by any of the switch control devices described above.

DETAILED DESCRIPTION

The technical solutions in the embodiments of the present disclosure are to be described clearly and thoroughly in the following in conjunction with the accompanying drawings. It is apparent that the embodiments as described are only a part rather than all of the embodiments of the present disclosure.

Figure 2:
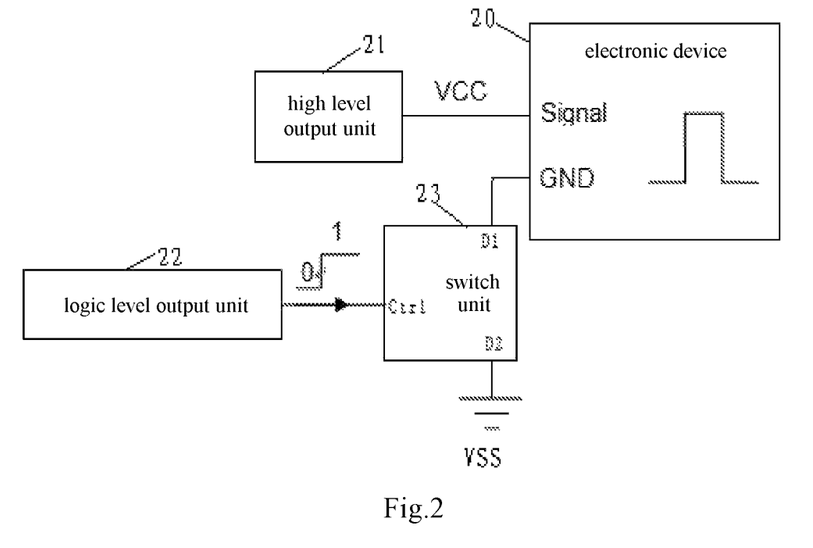
FIG. 2 is a structure diagram of a switch control device for electronic device according to the present disclosure.

FIG. 2 is a structure diagram of a switch control device for electronic device according to the present disclosure. As shown in FIG. 2, the control is device for electronic device is used for switch controlling of an electronic device 20, and the electronic device 20 comprises a ground terminal GND and a high level input terminal Signal.

The switch control device comprises:

a high level output unit 21, connected with the high level input terminal Signal and configured to output a high level VCC with a predetermined amplitude to the high level input terminal Signal; the predetermined amplitude higher than a predetermined voltage;

a logic level output unit 22 for outputting a logic level LS; and a switch unit 23, with a control terminal Ctrl inputted with the logic level, a first terminal D1 connected with the ground terminal GND, a second terminal D2 inputted with a low level VSS, and configured to switch on the first terminal D1 and the second terminal D2 when the logic level LS is in a first state, in order to turn on the electronic device 20, and to switch off the first terminal D1 from the second terminal D2 when the logic level LS is in a second state, in order to turn off the electronic device 20.

The switch control device outputs a high level VCC to a high level input terminal Signal of the electronic device via the high level output unit 21. Compared to the traditional technology, an amplitude of the high level VCC may be higher than a maximum convertible high voltage by an existing level converter, e.g. 5.5V, and the switch control device controls the ground terminal GND of the electronic device to be inputted with a low level VSS via the switch unit 23 when the logic level LS is in a first state. For example, the GND may be grounded, in which case a potential difference between the high level input terminal Signal and the ground terminal GND of the electronic device is VCC. Even if a turn-on voltage for the electronic device is higher than the maximum convertible voltage by an existing level converter, the switch control device provided by an embodiment of the present disclosure can successfully turn on the electronic device. When the logic level LS is in a second state, the switch unit 23 controls the ground terminal GND of the electronic device not to be inputted with the low level VSS, such that the ground terminal GND of the electronic device is suspended, and there is no potential difference between the high level input terminal Signal and the ground terminal GND of the electronic device, therefore the electronic device is not turned on.

Optionally, the high level output unit 21 may be used for outputting high levels with different predetermined amplitudes to the high level input terminal Signal in different time intervals, in order to satisfy the need of the electronic device for power supply at different time. For example, in the embodiment shown in FIG. 2, the amplitude of VCC in a different interval may be 6V, 12V, 24V or other voltage values.

The switch unit may comprise: a switch transistor, with a control terminal inputted with the logic level, a first terminal connected with the ground terminal, and a second terminal inputted with a low level.

When the logic level is in a first state, the switch transistor is switched on, the ground terminal of the electronic device is inputted with a low level, and when the logic level is in a second state, the switch transistor is switched off, the ground terminal of the electronic device is suspended.

The switch transistor may comprise a switch triode, with a base inputted with the logic level, a first terminal connected with the ground terminal, and a second terminal inputted with a low level.

When the logic level inputted to the switch triode is a high level, the switch triode is switched on, and when the logic level inputted to the switch triode is a low level, the switch triode is switched off.

In practice, the first terminal of the switch triode may be a collector or an emitter, and correspondingly, the second terminal of the switch triode may be an emitter or a collector.

Optionally, the switch transistor may comprise a switch MOS (Metal-Oxide-Semiconductor) transistor or a switch TFT (Thin Film Transistor). In that case, a gate of the switch transistor is inputted with the logic level, a first terminal is connected with the ground terminal, and a second terminal is inputted with a low level; when the logic level is in a first state, the switch MOS transistor or switch TFT is switched on, the ground terminal of the electronic device is inputted with a low level; and when the logic level is in a second state, the switch MOS transistor or switch TFT is switched off, the ground terminal of the electronic device is inputted with a low level.

In practice, the first terminal of the switch triode may be a source or a drain, and correspondingly, the second terminal of the switch triode may be a drain or a source.

The switching on and off speed of the switch MOS transistor and the switch TFT is quite fast; especially when the switch transistor is a switch MOS transistor, the switching on and off speed of the switch MOS transistor and the switch TFT can satisfy the application in an electronic device for a high-speed display.

In a case where the switch transistor comprises a switch MOS transistor or a switch TFT, if the switch transistor is an N-type transistor, the logic level is a high level when the logic level is in a first state, and the logic level is a low level when the logic level is in a second state; if the switch transistor is a P-type transistor, the logic level is a low level when the logic level is in a first state, and the logic level is a high level when the logic level is in a second state.

The switch control device for electronic device provided by the present disclosure is illustrated below. In the following embodiments, the electronic device includes, but is not limited to, an industrial camera or a radio-frequency (RF) switch, or may be other electronic devices with switch controlled by a pulse control signal.

In the following embodiments, the logic level output unit may be a logic level controller, e.g. an FPGA (Field-Programmable Gate Array), a DSP, an ARM micro-processor or a single-chip microcomputer, but is not limited to these. The logic level output unit may be any device that can output a logic level.

Figure 3A:
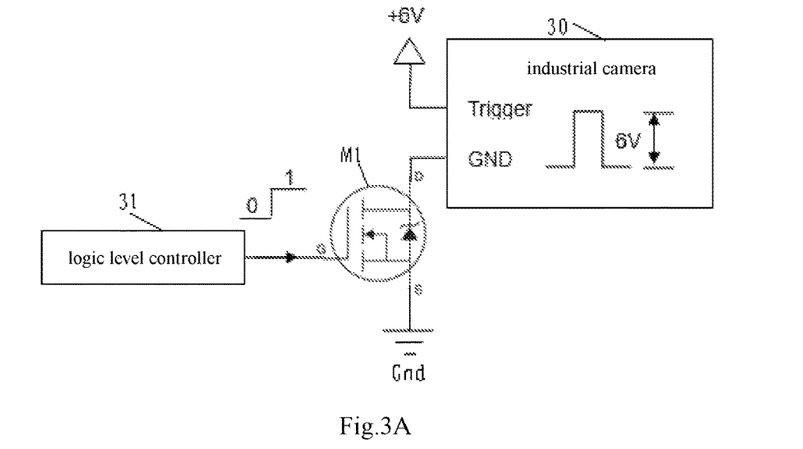
FIG. 3A is a structure diagram of a first embodiment of the switch control device for electronic device according to the present disclosure.

As shown in FIG. 3A, in a first embodiment of the switch control device for electronic device provided by the present disclosure, the electronic device is an industrial camera 30, of which the high level input terminal is a triggering interface Trigger for the industrial camera, and the amplitude of a high level outputted by the high level output unit (not shown in FIG. 3A) is 6V.

The switch unit is a switch MOS transistor M1, and M1 is an N-channel enhancement mode MOS transistor; a gate G of M1 is connected with a logic level output terminal of a logic level controller 31, a drain electrode D of M1 is connected with a ground terminal GND of the industrial camera 30, and a source electrode S of M1 is connected with the ground Gnd.

When the logic level controller 31 outputs a logic "1", i.e. a logic level outputted by the logic level controller 31 is a high level, M1 is switched on. As the ground terminal GND of the industrial camera 30 is grounded, a potential difference between the interface Trigger and the GND is 6V. For the industrial camera, the amplitude of a triggering level as received is 6V, which satisfies the requirement of the industrial camera for a signal level, and thus enables the triggering function of the industrial camera.

When the logic level controller 31 outputs a logic "0", i.e. a logic level outputted by the logic level controller 31 is a low level, M1 is switched off. Then, the ground terminal GND of the industrial camera 30 is suspended, and there is no potential difference between the interface Trigger and the GND. For the industrial camera, a triggering level as received is a low level, which does not satisfy the requirement for triggering.

Figure 3B:
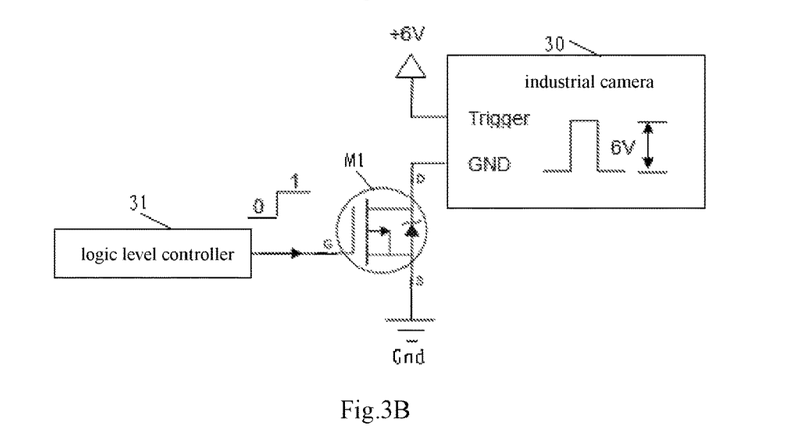
FIG. 3B is a structure diagram of a second embodiment of the switch control device for electronic device according to the present disclosure.

As shown in FIG. 3B, in a second embodiment of the switch control device for electronic device provided by the present disclosure, the electronic device is an industrial camera 30, of which the high level input terminal is a triggering interface Trigger for the industrial camera, and the amplitude of a high level outputted by the high level output unit (not shown in FIG. 3B) is 6V.

The switch unit is a switch MOS transistor M1, and M1 is a P-channel depletion mode MOS transistor; a gate G of M1 is connected with a logic level output terminal of a logic level controller 31, a drain D of M1 is connected with a ground terminal GND of the industrial camera 30, and a source S of M1 is connected with the ground Gnd.

When the logic level controller 31 outputs a logic "1", i.e. a logic level outputted by the logic level controller 31 is a high level, M1 is switched on. As the ground terminal GND of the industrial camera 30 is grounded, a potential difference between the interface Trigger and the GND is 6V. For the industrial camera, the amplitude of a triggering level as received is 6V, which satisfies the requirement of the industrial camera for a signal level, and thus enables the triggering function of the industrial camera.

When the logic level controller 31 outputs a logic "0", i.e. a logic level outputted by the logic level controller is a low level, M1 is switched off. Then, the ground terminal GND of the industrial camera 30 is suspended, and there is no potential difference between the interface Trigger and the GND. For the industrial camera, a triggering level as received is a low level, which does not satisfy the requirement for triggering.

Figure 3C:
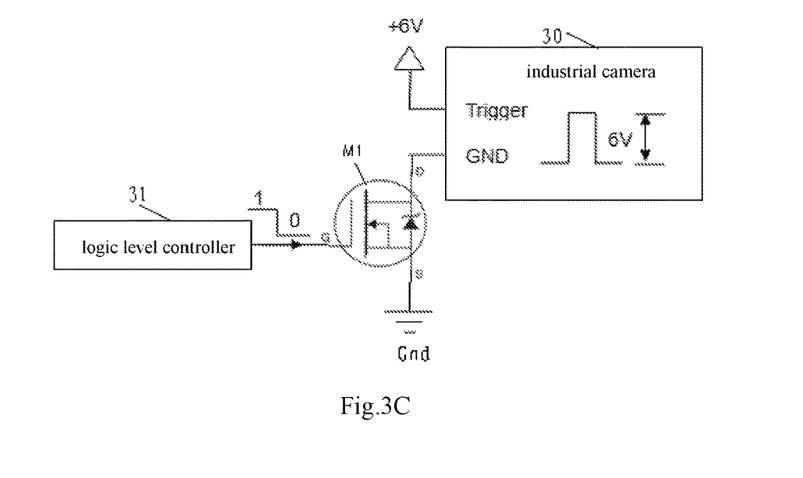
FIG. 3C is a structure diagram of a third embodiment of the switch control device for electronic device according to the present disclosure.

As shown in FIG. 3C, in a third embodiment of the switch control device for electronic device provided by the present disclosure, the electronic device is an industrial camera 30, of which the high level input terminal is a triggering interface Trigger for the industrial camera, and the amplitude of a high level outputted by the high level output unit (not shown in FIG. 3C) is 6V.

The switch unit is a switch MOS transistor M1, and M1 is an N-channel depletion mode MOS transistor; a gate G of M1 is connected with a logic level output terminal of a logic level controller 31, a drain D of M1 is connected with a ground terminal GND of the industrial camera 30, and a source S of M1 is connected with the ground Gnd.

When the logic level controller 31 outputs a logic "0", i.e. a logic level outputted by the logic level controller 31 is a low level, M1 is switched on. As the ground terminal GND of the industrial camera 30 is grounded, a potential difference between the interface Trigger and the GND is 6V. For the industrial camera, the amplitude of a triggering level as received is 6V, which satisfies the requirement of the industrial camera for a signal level, and thus enables the triggering function of the industrial camera.

When the logic level controller 31 outputs a logic "1", i.e. a logic level outputted by the logic level controller 31 is a high level, M1 is switched off. Then, the ground terminal GND of the industrial camera 30 is suspended, and there is no potential difference between the interface Trigger and the GND. For the industrial camera, a triggering level as received is a low level, which does not satisfy the requirement for triggering.

Figure 3D:
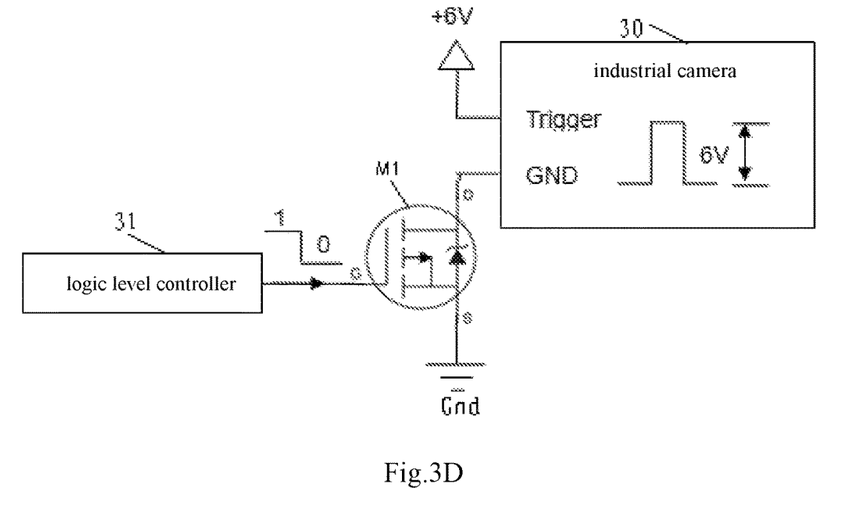
FIG. 3D is a structure diagram of a fourth embodiment of the switch control device for electronic device according to the present disclosure.

As shown in FIG. 3D, in a fourth embodiment of the switch control device for electronic device provided by the present disclosure, the electronic device is an industrial camera 30, of which the high level input terminal is a triggering interface Trigger for the industrial camera, and the amplitude of a high level outputted by the high level output unit (not shown in FIG. 3D) is 6V.

The switch unit is a switch MOS transistor M1, and M1 is a P-channel enhancement mode MOS transistor; a gate G of M1 is connected with a logic level output terminal of a logic level controller 31, a drain D of M1 is connected with a ground terminal GND of the industrial camera 30, and a source S of M1 is connected with the ground Gnd.

When the logic level controller 31 outputs a logic "0", i.e. a logic level outputted by the logic level controller 31 is a low level, M1 is switched on. As the ground terminal GND of the industrial camera 30 is grounded, a potential difference between the interface Trigger and the GND is 6V. For the industrial camera, the amplitude of a triggering level as received is 6V, which satisfies the requirement of the industrial camera for a signal level, and thus enables the triggering function of the industrial camera.

When the logic level controller 31 outputs a logic "1", i.e. a logic level outputted by the logic level controller 31 is a high level, M1 is switched off. Then, the ground terminal GND of the industrial camera 30 is suspended, and there is no potential difference between the interface Trigger and the GND. For the industrial camera, a triggering level as received is a low level, which does not satisfy the requirement for triggering.

Figure 4A:
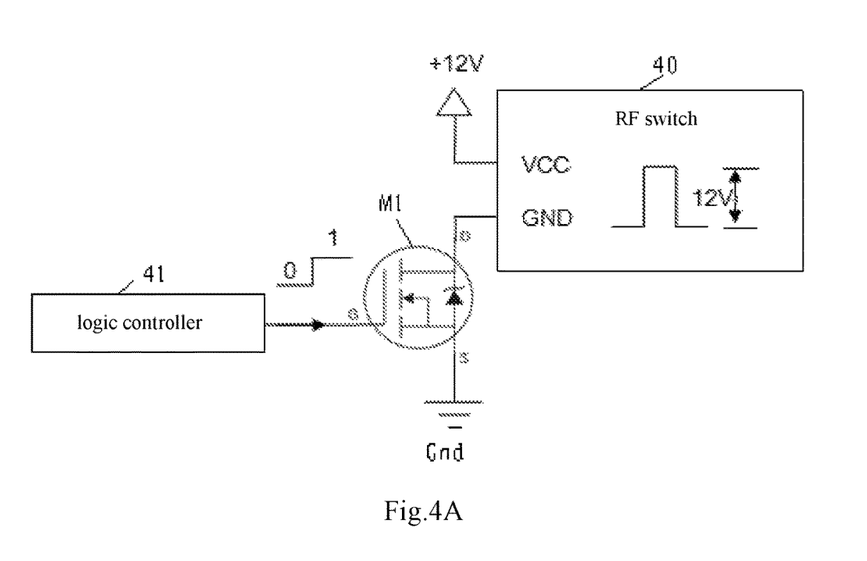
FIG. 4A is a structure diagram of a fifth embodiment of the switch control device for electronic device according to the present disclosure.

As shown in FIG. 4A, in a fifth embodiment of the switch control device for electronic device provided by the present disclosure, the electronic device is an RF switch 40, of which the high level input terminal is a high level terminal VCC of the RF switch 40, and the amplitude of a high level outputted by the high level output unit (not shown in FIG. 4A) is 12V.

The switch unit is a switch MOS transistor M1, and M1 is an N-channel enhancement mode MOS transistor; a gate G of M1 is connected with a logic level output terminal of a logic level controller 41, a drain D of M1 is connected with a ground terminal GND of the RF switch 40, and a source S of M1 is connected with the ground Gnd.

When the logic level controller 41 outputs a logic "1", i.e. a logic level outputted by the logic level controller 41 is a high level, M1 is switched on. As the ground terminal GND of the RF switch 40 is grounded, a potential difference between the VCC and the GND is 6V. For the RF switch, the amplitude of a triggering level as received is 6V, which satisfies the requirement of the RF switch for a signal level, and thus enables the triggering function of the RF switch.

When the logic level controller 41 outputs a logic "0", i.e. a logic level outputted by the logic level controller is a low level, M1 is switched off. Then, the ground terminal GND of the RF switch 40 is suspended, and there is no potential difference between the VCC and the GND. For the RF switch, a triggering level as received is a low level, which does not satisfy the requirement for triggering.

Figure 4B:
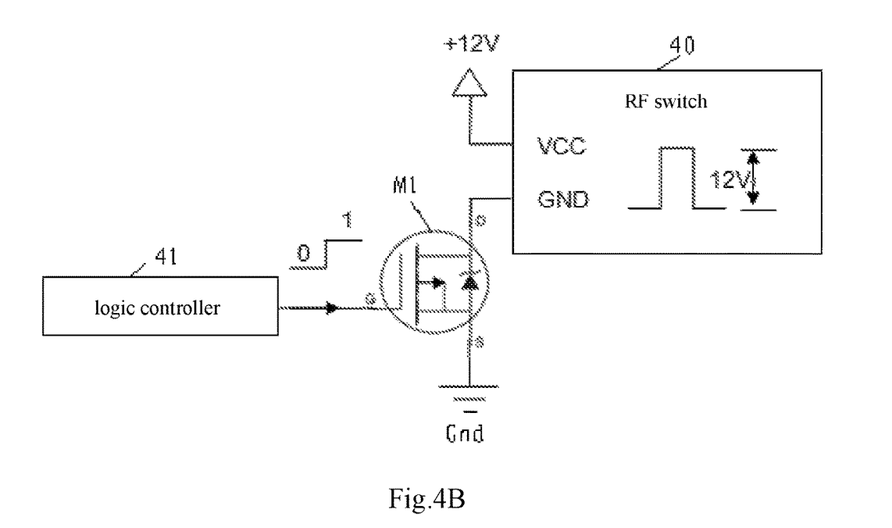
FIG. 4B is a structure diagram of a sixth embodiment of the switch control device for electronic device according to the present disclosure.

As shown in FIG. 4B, in a sixth embodiment of the switch control device for electronic device provided by the present disclosure, the electronic device is an RF switch 40, of which the high level input terminal is a high level terminal VCC of the RF switch 40, and the amplitude of a high level outputted by the high level output unit (not shown in FIG. 4B) is 12V.

The switch unit is a switch MOS transistor M1, and M1 is a P-channel depletion mode MOS transistor; a gate G of M1 is connected with a logic level output terminal of a logic level controller 41, a drain D of M1 is connected with a ground terminal GND of the RF switch 40, and a source S of M1 is connected with the ground Gnd.

When the logic level controller 41 outputs a logic "1", i.e. a logic level outputted by the logic level controller 41 is a high level, M1 is switched on. As the ground terminal GND of the RF switch 40 is grounded, a potential difference between the VCC and the GND is 6V. For the RF switch, the amplitude of a triggering level as received is 6V, which satisfies the requirement of the RF switch for a signal level, and thus makes the triggering function of the RF switch.

When the logic level controller 41 outputs a logic "0", i.e. a logic level outputted by the logic level controller 41 is a low level, M1 is switched off. Then, the ground terminal GND of the RF switch 40 is suspended, and there is no potential difference between the VCC and the GND. For the RF switch, a triggering level as received is a low level, which does not satisfy the requirement for triggering.

Figure 4C:
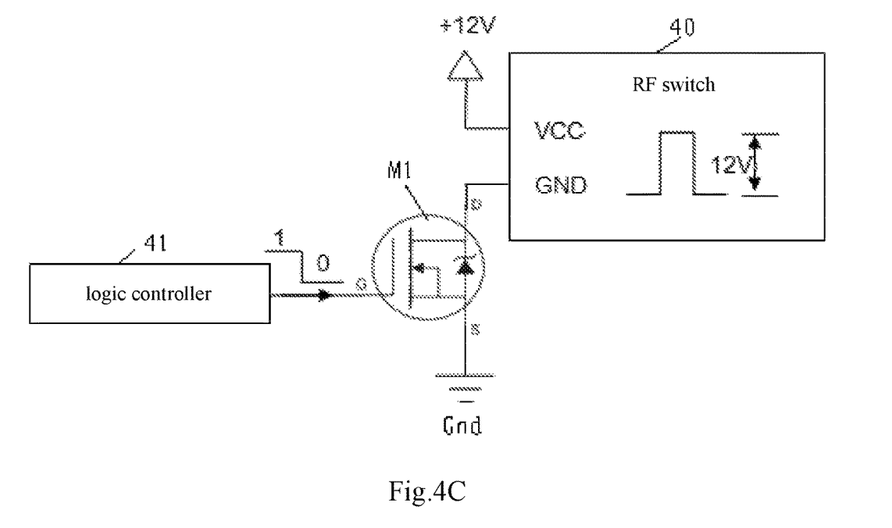
FIG. 4C is a structure diagram of a seventh embodiment of the switch control device for electronic device according to the present disclosure.

As shown in FIG. 4C, in a seventh embodiment of the switch control device for electronic device provided by the present disclosure, the electronic device is an RF switch 40, of which the high level input terminal is a high level terminal VCC of the RF switch 40, and the amplitude of a high level outputted by the high level output unit (not shown in FIG. 4C) is 12V.

The switch unit is a switch MOS transistor M1, and M1 is an N-channel depletion mode MOS transistor; a gate G of M1 is connected with a logic level output terminal of a logic level controller 41, a drain D of M1 is connected with a ground terminal GND of the RF switch 40, and a source S of M1 is connected with the ground Gnd.

When the logic level controller 41 outputs a logic "0", i.e. a logic level outputted by the logic level controller 41 is a low level, M1 is switched on As the ground terminal GND of the RF switch 40 is grounded, a potential difference between the VCC and the GND is 6V. For the RF switch, the amplitude of a triggering level as received is 6V, which satisfies the requirement of the RF switch for a signal level, and thus enables the triggering function of the RF switch.

When the logic level controller 41 outputs a logic "1", i.e. a logic level outputted by the logic level controller 41 is a high level, M1 is switched off. Then, the ground terminal GND of the RF switch 40 is suspended, and there is no potential difference between the VCC and the GND. For the RF switch, a triggering level as received is a low level, which does not satisfy the requirement for triggering.

Figure 4D:
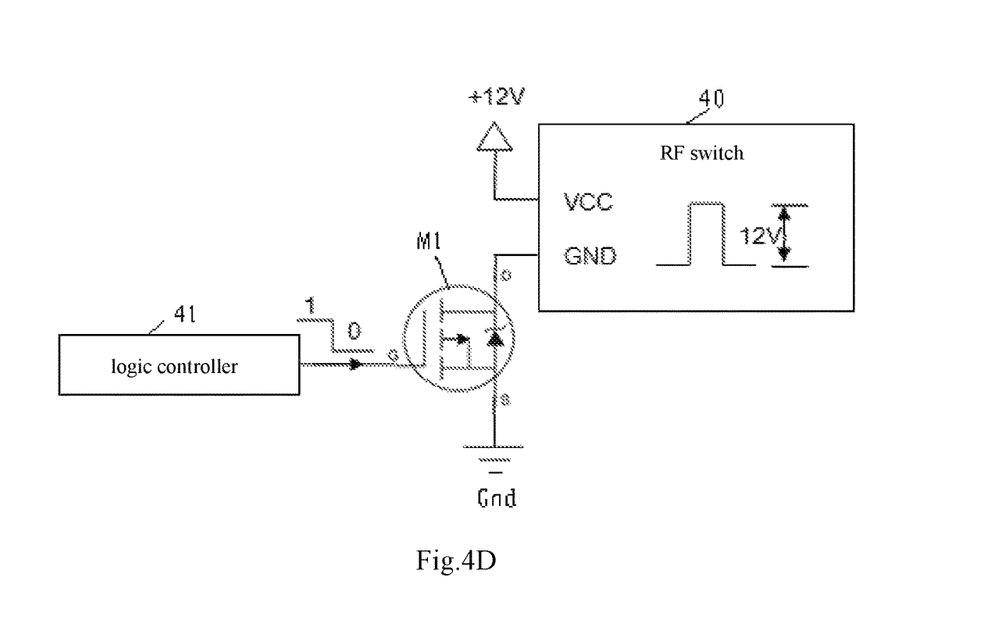
FIG. 4D is a structure diagram of an eighth embodiment of the switch control device for electronic device according to the present disclosure.

As shown in FIG. 4D, in an eighth embodiment of the switch control device for electronic device provided by the present disclosure, the electronic device is an RF switch 40, of which the high level input terminal is a high level terminal VCC of the RF switch 40, and the amplitude of a high level outputted by the high level output unit (not shown in FIG. 4D) is 12V.

The switch unit is a switch MOS transistor M1, and M1 is a P-channel enhancement mode MOS transistor; a gate G of M1 is connected with a logic level output terminal of a logic level controller 41, a drain D of M1 is connected with a ground terminal GND of the RF switch 40, and a source electrode S of M1 is connected with the ground Gnd.

When the logic level controller 41 outputs a logic "0", i.e. a logic level outputted by the logic level controller 41 is a low level, M1 is switched on. As the ground terminal GND of the RF switch 40 is grounded, a potential difference between the VCC and the GND is 6V. For the RF switch, the amplitude of a triggering level as received is 6V, which satisfies the requirement of the RF switch for a signal level, and thus enables the triggering function of the RF switch.

When the logic level controller 41 outputs a logic "1", i.e. a logic level outputted by the logic level controller 41 is a high level, M1 is switched off. Then, the ground terminal GND of the RF switch 40 is suspended, and there is no potential difference between the VCC and the GND. For the RF switch, a triggering level as received is a low level, which does not satisfy the requirement for triggering.

Figure 5:
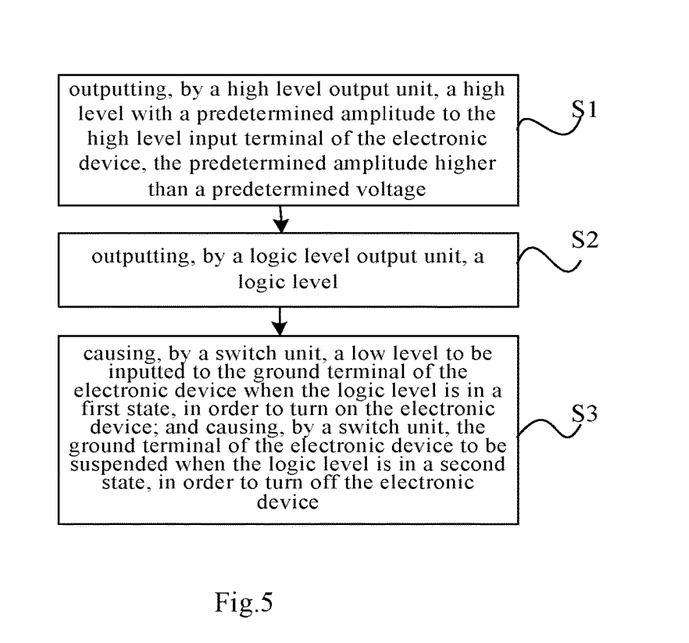
FIG. 5 is a flow chat of a switch control method for electronic device according to the present disclosure.

FIG. 5 shows a switch control method for electronic device according to an embodiment of the present disclosure, which is used for switch controlling of an electronic device. The electronic device comprises a ground terminal and a high level input terminal. The switch control method comprises:

S1: outputting, by a high level output unit, a high level with a predetermined amplitude to the high level input terminal of the electronic device, the predetermined amplitude higher than a predetermined voltage;

S2: outputting, by a logic level output unit, a logic level;

S3: when the logic level is in a first state, causing, by a switch unit, a low level to be inputted to the ground terminal of the electronic device, in order to turn on the electronic device; when the logic level is in a second state, causing, by a switch unit, the ground terminal of the electronic device to be suspended, in order to turn off the electronic device.

The switch control method provided by an embodiment of the present disclosure outputs a high level to the high level input terminal of the electronic device via the high level output unit. Compared to the traditional technology, an amplitude of the high level may be higher than a maximum convertible high voltage by an existing level converter, e.g. 5.5V; and the switch control method provided by an embodiment of the present disclosure causes the ground terminal of the electronic device to be inputted with a low level via the switch unit when the logic level is in a first state. For example, at this time, the ground terminal of the electronic device may be grounded. In this case, a turn-on voltage for the electronic device is higher than the maximum convertible voltage by an existing level converter, and thus can successfully turn on the electronic device. When the logic level is in a second state, the switch unit causes the ground terminal of the electronic device not to be inputted with the low level, such that the ground terminal of the electronic device is suspended, and there is no potential difference between the high level input terminal and the ground terminal of the electronic device, therefore the electronic device is not turned on.

Optionally, the step of outputting, by the high level output unit, a high level with a predetermined amplitude to the high level input terminal of the electronic device comprises:

outputting, by the high level output unit, high levels with different predetermined amplitudes to the high level input terminal in different time intervals.

Optionally, the switch unit may comprise a switch transistor; and wherein the step of when the logic level is in a first state, causing, by a switch unit, a low level to be inputted to the ground terminal of the electronic device, and when the logic level is in a second state, causing, by a switch unit, the ground terminal of the electronic device to be suspended comprises:

when the logic level is a first level, the switch transistor switches on the connection between the ground terminal and a low level input terminal of the electronic device, and when the logic level is a second level, the switch transistor switches off the connection between the ground terminal and the low level input terminal of the electronic device, in order to make the ground terminal of the electronic device to be suspended.

An electronic device provided by an embodiment of the present disclosure comprises a ground terminal and a high level input terminal, which electronic device is configured to be controlled by the above switch control device.

Above are disclosed optional embodiments of the present invention. It should be noted that for an ordinarily skilled in the art, certain improvements and changes can be made to the embodiments of present invention without departing from the principle of the invention, and these improvements and changes are regarded as within the scope of the present invention.

The invention claimed is:

1. A switch control device for an electronic device comprising a ground terminal and a high level input terminal, the switch control device comprising:

a high level output unit connected with the high level input terminal and configured to output a high level with a predetermined amplitude to the high level input terminal, the predetermined amplitude higher than a predetermined voltage;

a logic level output unit configured to output a logic level; and, a switch unit, with a control terminal inputted with the logic level, a first terminal connected with the ground terminal, and a second terminal inputted with a low level, and configured to connect the first terminal and the second terminal when the logic level is in a first state, in order to turn on the electronic device, and to disconnect the first terminal from the second terminal when the logic level is in a second state, in order to turn off the electronic device;

wherein the high level output unit is configured to output high levels with different amplitudes to the high level input terminal different time intervals.

2. The switch control device for electronic device according to claim 1, wherein the switch unit comprises: a switch transistor, with a control terminal inputted with the logic level, a first terminal connected with the ground terminal, and a second terminal inputted with a low level.

3. The switch control device for electronic device according to claim 2, wherein the switch transistor comprises a switch triode, with a base inputted with the logic level, a first terminal connected with the ground terminal, and a second terminal inputted with a low level.

4. The switch control device for electronic device according to claim 2, wherein the switch transistor comprises a switch MOS transistor, with a gate inputted with the logic level, a first terminal connected with the ground terminal, and a second terminal inputted with a low level.

5. The switch control device for electronic device according to claim 4, wherein the switch MOS transistor is an N-channel enhancement mode MOS transistor or a P-channel depletion mode MOS transistor, and wherein the logic level is a high level when the logic level is in a first state, and the logic level is a low level when the logic level is in a second state.

6. The switch control device for electronic device according to claim 4, wherein the switch transistor is a P-channel enhancement mode transistor or an N-channel depletion mode transistor, and wherein the logic level is a low level when the logic level is in a first state, and the logic level is a high level when the logic level is in a second state.

7. The switch control device for electronic device according to claim 2, wherein the switch transistor comprises a switch TFT, with a gate inputted with the logic level, a first terminal connected with the ground terminal, and a second terminal inputted with a low level.

8. An electronic device comprising a ground terminal and a high level input terminal, wherein the electronic device is configured to be controlled by the switch control device according to claim 1.

9. The electronic device according to claim 8, wherein the high level output unit is configured to output high levels with different amplitudes to the high level input terminal in different time intervals.

10. The electronic device according to claim 8, wherein the switch unit comprises: a switch transistor, with a control terminal inputted with the logic level, a first terminal connected with the ground terminal, and a second terminal inputted with a low level.

11. The electronic device according to claim 10, wherein the switch transistor comprises a switch triode, with a base inputted with the logic level, a first terminal connected with the ground terminal, and the second terminal inputted with a low level.

12. The electronic device according to claim 10, wherein the switch transistor comprises a switch MOS transistor, with a gate inputted with the logic level, a first terminal connected with the ground terminal, and a second terminal inputted with a low level.

13. The electronic device according to claim 12, wherein the switch MOS transistor is an N-channel enhancement mode MOS transistor or a P-channel depletion mode MOS transistor, and wherein the logic level is a high level when the logic level is in a first state, and the logic level is a low level when the logic level is in a second state.

14. The electronic device according to claim 12, wherein the switch transistor is a P-channel enhancement mode transistor or an N-channel depletion mode transistor, and wherein the logic level is a low level when the logic level is in a first state, and the logic level is a high level when the logic level is in a second state.

15. The electronic device according to claim 10, wherein the switch transistor comprises a switch TFT, with a gate inputted with the logic level, a first terminal connected with the ground terminal, and a second terminal inputted with a low level.

16. A switch control method for an electronic device comprising a ground terminal and a high level input terminal, the switch control method comprising:
    outputting, by a high level output unit, a high level with a predetermined amplitude to the high level input terminal of the electronic device, the predetermined amplitude higher than a predetermined voltage;
    outputting, by a logic level output unit, a logic level;
    causing, by a switch unit, a low level to be inputted to the ground terminal of the electronic device when the logic level is in a first state, in order to turn on the electronic device; and causing, by the switch unit, the ground terminal of the electronic device to be suspended when the logic level is in a second state, in order to turn off the electronic device;
    wherein said outputting, by the high level output unit, a high level with a predetermined amplitude to the high level input terminal of the electronic device comprises:
    outputting, the high level output unit, high levels with different predetermined amplitudes to the high level input terminal in different time intervals.

17. The switch control method for electronic device according to claim 16, wherein causing, by the switch unit, a low level to be inputted to the ground terminal of the electronic device when the logic level is in a first state and causing, by a switch unit, the ground terminal of the electronic device to be suspended when the logic level is in a second state comprises:
    switching on, by a switch transistor, the connection between the ground terminal and a low level input terminal of the electronic device when the logic level is a first level; and
    switching off, by the switch transistor, the connection between the ground terminal and the low level input terminal of the electronic device when the logic level is a second level, in order to make the ground terminal of the electronic device to be suspended.

* * * * *